US012040800B2

(12) United States Patent
Rasouli et al.

(10) Patent No.: US 12,040,800 B2
(45) Date of Patent: Jul. 16, 2024

(54) LOW HOLD MULTI-BIT FLIP-FLOP

(71) Applicant: Taiwan Semiconductor Manufacturing Company, Ltd., Hsinchu (TW)

(72) Inventors: Seid Hadi Rasouli, Hsinchu (TW); Jerry Chang Jui Kao, Taipei (TW); Xiangdong Chen, San Diego, CA (US); Tzu-Ying Lin, Hsinchu (TW); Yung-Chen Chien, Hsinchu (TW); Shao-Lun Chien, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/064,961

(22) Filed: Dec. 13, 2022

(65) Prior Publication Data
US 2023/0114367 A1    Apr. 13, 2023

Related U.S. Application Data

(63) Continuation of application No. 17/026,423, filed on Sep. 21, 2020, now Pat. No. 11,558,040.

(60) Provisional application No. 62/907,748, filed on Sep. 30, 2019.

(51) Int. Cl.
| | |
|---|---|
| *H03K 3/03* | (2006.01) |
| *G01R 31/317* | (2006.01) |
| *G01R 31/3177* | (2006.01) |
| *H03K 3/037* | (2006.01) |
| *H03K 19/20* | (2006.01) |

(52) U.S. Cl.
CPC ..... *H03K 3/0372* (2013.01); *G01R 31/31725* (2013.01); *G01R 31/3177* (2013.01); *H03K 19/20* (2013.01)

(58) Field of Classification Search
CPC .................................................... H03K 3/037
USPC ................................ 327/202, 203, 208, 218
See application file for complete search history.

(56) References Cited

U.S. PATENT DOCUMENTS

| | | | |
|---|---|---|---|
| 9,310,435 B2 | 4/2016 | Chen et al. | |
| 2013/0262943 A1* | 10/2013 | Lakshmipathy ... | G01R 31/3187 714/E11.155 |
| 2014/0122949 A1 | 5/2014 | Elkin et al. | |
| 2014/0266365 A1* | 9/2014 | Penzes ............... | H03K 3/35625 327/203 |
| 2015/0070063 A1 | 3/2015 | Gurumurthy et al. | |
| 2017/0141766 A1 | 5/2017 | Kao et al. | |
| 2017/0292995 A1 | 10/2017 | Semenov et al. | |
| 2018/0152175 A1 | 5/2018 | Lai et al. | |

(Continued)

FOREIGN PATENT DOCUMENTS

WO      2017213754 A1    12/2017

*Primary Examiner* — Quan Tra
(74) *Attorney, Agent, or Firm* — Jones Day

(57) ABSTRACT

Circuits, systems, and methods are described herein for increasing a hold time of a master-slave flip-flop. A flip-flop includes circuitry configured to receive a scan input signal and generate a delayed scan input signal; a master latch configured to receive a data signal and the delayed scan input signal; and a slave latch coupled to the master latch, the master latch selectively providing one of the data signal (Continued)

or the delayed scan input signal to the slave latch based on a scan enable signal received by the master latch.

20 Claims, 5 Drawing Sheets

(56) References Cited

U.S. PATENT DOCUMENTS

2018/0224505 A1     8/2018   Lin et al.

\* cited by examiner

LOW HOLD MULTI-BIT FLIP-FLOP

PRIORITY CLAIM

This application is a continuation of U.S. patent application Ser. No. 17/026,423, filed Sep. 21, 2020, which claims priority to U.S. Provisional Application No. 62/907,748, filed Sep. 30, 2019, the contents of which are incorporated by reference herein in their entirety.

TECHNICAL FIELD

This relates to semiconductor device design and more particularly to scan flip-flop circuits and, more particularly, to scan flip-flop circuits used to perform a scan test for a semiconductor integrated circuit.

BACKGROUND

Most digital circuits use one or more clock signals that determine the rate at which functional units of the circuit operate. Circuits that use such clock signals are commonly referred to as synchronous circuits. The time difference between the arrival of a clock signal at different points of a synchronous circuit is known as clock skew. To enable proper functioning of a synchronous circuit, clock skew must be maintained at an acceptable level.

BRIEF DESCRIPTION OF THE DRAWINGS

Aspects of the present disclosure are best understood from the following detailed description when read with the accompanying figures.

DETAILED DESCRIPTION

Figure 1:
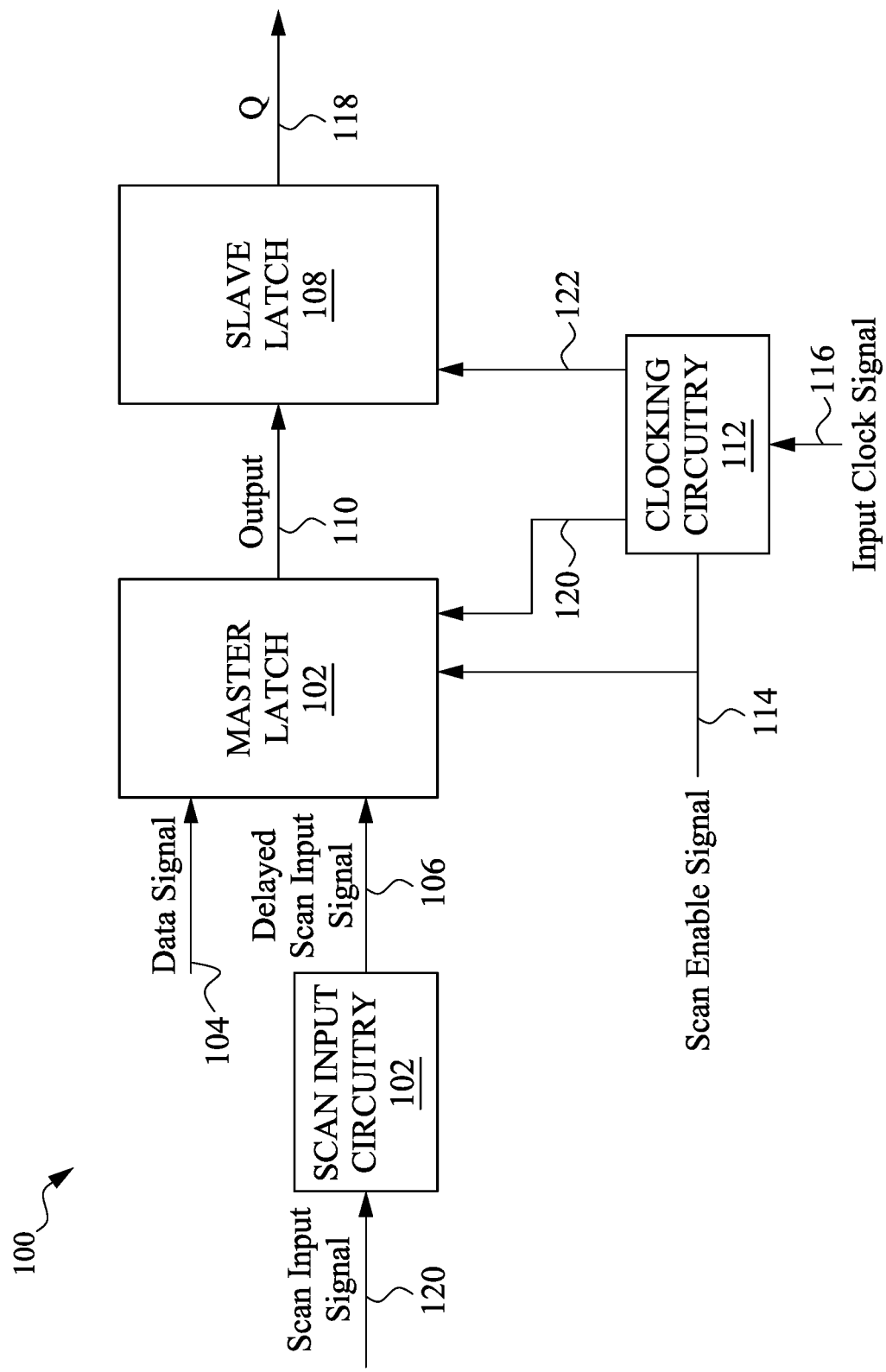
FIG. 1 depicts a block diagram of a master-slave flip-flop in accordance to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Behind every computer, smart television, mobile phone, or any other digital electronic device is an integrated circuit (IC) chip. That IC chip includes one or more components that form electrical circuits. Analog or digital signals flow through those electrical circuits and enable them to operate. That operation can depend, in part, on the timing of when those signals reach certain components within the circuits, especially for certain types of circuits such as synchronous circuits. When the timing of signals is off (e.g., the signal arrives at a particular point of the circuit earlier or later than expected) this is known as a timing violation.

Static timing analysis (STA) is a type of analysis that can help to identify timing violations. In using STA to evaluate synchronous circuits (e.g., circuits having one or more flip-flops) there are two key times evaluated: (i) a setup time and (ii) a hold time. The hold time is a minimum amount of time that an input of a flip-flop must be stable after a clock edge of an input clock signal. When the hold time measured for a given circuit is less than an expected hold time, the circuit has a hold time violation. Remedying of a hold time violation can include the use of additional circuitry (e.g., a buffer inside flip-flop and/or an OR gate) at a scan path input of the flip-flop. The scan path circuitry described herein can increase a delay in a scan input signal path and in turn improve the hold time.

FIG. 1 depicts a block diagram of a master-slave flip-flop 100 in accordance to various embodiments of the present disclosure. The flip-flop 100 includes a master latch 102 and a slave latch 108. The master latch 102 includes an input node configured to receive a data signal 104. In an example, the data signal 104 is propagated to the master-slave flip-flop 100 via combinatorial logic of a sequential circuit. The master latch 102 is further configured to receive a first clock signal 120. The first clock signal 120 is provided by clocking circuitry 112 and is based on an input clock signal 116 that is received by the clocking circuitry 112.

The master latch 102 is further configured to receive a delayed scan input signal 106 and a scan enable (SE) signal 114. The delayed scan input signal 106 is a delayed version of scan input signal 120. The scan input signal 120 can be delayed using scan input circuit 120, which is described in more detail in FIGS. 2-4. When the SE signal 114 has a first logic level (e.g., when SE is inactive or low), the master latch 102 passes the data signal 104 to its output node 110. Conversely, when the SE signal 114 has a second logic level (e.g., when SE is active or high), the master latch 102 passes the delayed scan input signal 106 to the output node 110. The assertion of the SE signal 114 with the second logic level is used to implement a scan testing mode of the master-slave flip-flop 100. In the scan testing mode, one or more test patterns of data are written to a plurality of flip-flops, such as the master-slave flip-flop 100 of FIG. 1, that are typically arranged in a scan chain, and the test patterns are then read out to test the data storage functionality of the flip-flops.

The master-slave flip-flop 100 of FIG. 1 further includes the slave latch 108, which is configured to receive the output 110 of the master latch 102. As previously described, the master latch 102 selectively provides one of the data signal 104 or the delayed scan input signal 106 to the slave latch 108 based on the SE signal 114 received by the master latch 102. Thus, in an example, depending on the SE signal 114, either the function data or the scan data is latched from the master latch 102 to the slave latch 108. The slave latch 108 is further configured to receive a second clock signal 122, which is provided by the clocking circuitry 112 and is based on the input clock signal 116. An output node, Q, 118 of the master-slave flip-flop 100 is included on the slave latch 108 and is used to read data out of the master-slave flip-flop 100. In an example, the master-slave flip-flop 100 includes a storage cell that provides data storage. In some variations, the master-slave flip-flop 100 is a single bit flip-flop (e.g., facilitates storage of a single bit of data). In other variations, the master-slave flip-flop 100 is a multi-bit flip-flop (e.g., facilitates storage of multiple bits of data).

In some variations when the input clock signal 116 is low, the master latch 102 is transparent (e.g., ready to sample and store a data value) and the slave latch 108 is opaque (e.g., not sampling, but instead holding a previously sampled data value). In this variation, when the input clock signal 116 goes high, the master latch 102 becomes opaque, and the slave latch 108 becomes transparent to effect a positive edge-triggered behavior. Alternatively, in another example embodiment, when the input clock signal 116 is high, the master latch 102 is transparent and the slave latch 108 is opaque. In this variation, when the input clock signal 116 goes low, the master latch 102 becomes opaque, and the slave latch 108 becomes transparent to effect a negative edge-triggered behavior. Thus, the master-slave flip-flop 100 may be a positive edge-triggered flip-flop or a negative edge-triggered flip-flop.

The SE signal 114 facilitates operation of the master-slave flip-flop 100 in two modes: a functional mode and a scan testing mode. When the SE signal 114 is low (e.g., logical '0'), the master-slave flip-flop 100 is operating in a functional mode. When the SE signal 114 is high (e.g., logical '1'), the master-slave flip-flop 100 is operating in a scan testing mode. A result of the delaying of the master clock relative to the slave clock in both functional and scan testing modes is hold time violations on the scan path (e.g., hold time violations resulting from the master and slave latches being driven by clocks with overlapping phases in the scan testing mode).

In the functional mode (e.g., when the SE signal 114 is inactive or low), the scan input circuitry 112 is not operational and does not pass the delayed scan input signal 106 to the master latch 102. By contrast, in the scan testing mode (e.g., when the SE signal 114 is active or high), the scan input circuitry 112 is operational and generates the delayed scan input signal 106 for input to the master latch 102 as described in detail in FIGS. 2-4.

Figure 2:
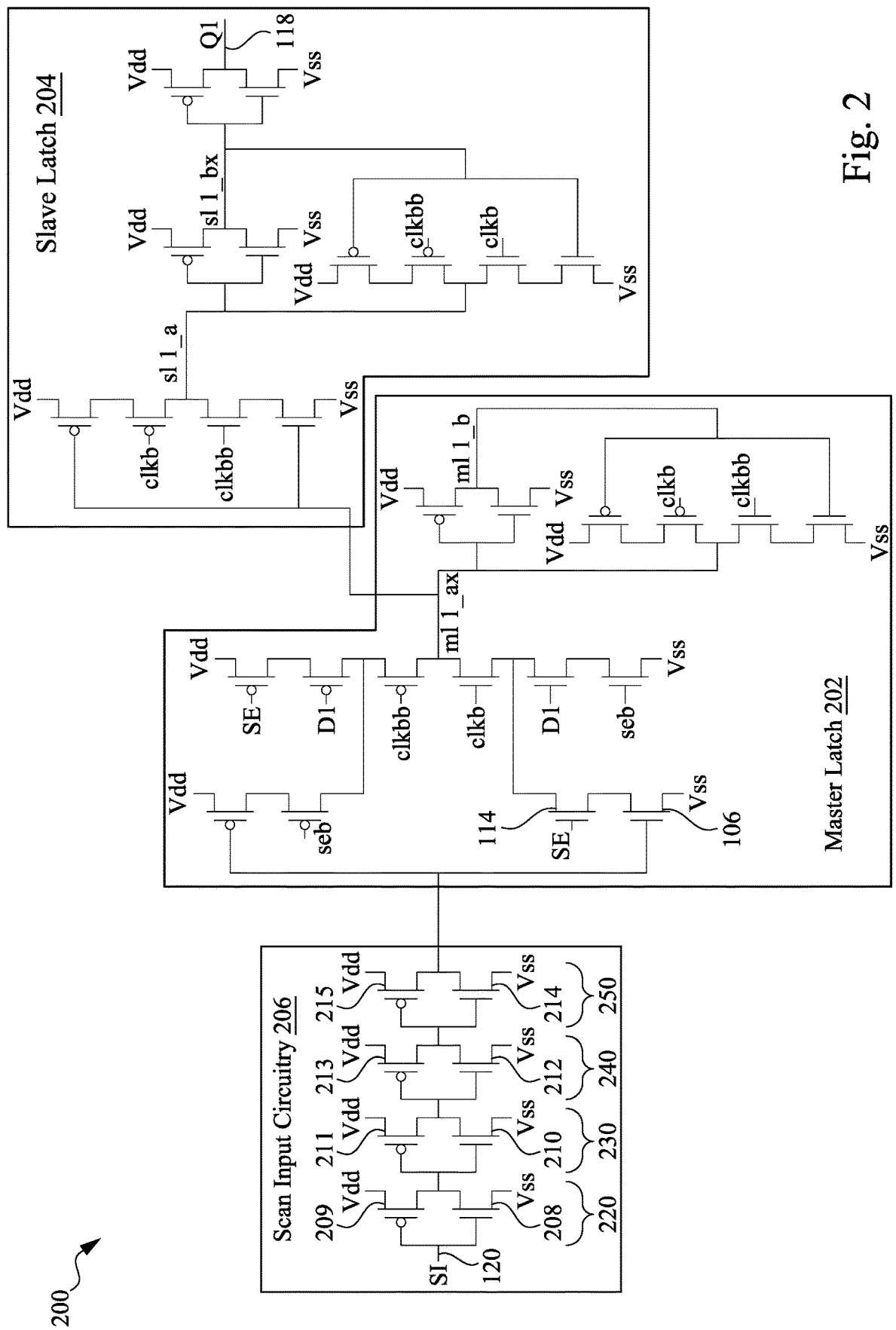
FIG. 2 is a circuit diagram depicting details of an exemplary master-slave latch configuration of a master-slave flip-flop in accordance with various embodiments of the present disclosure.

FIG. 2 is a circuit diagram depicting details of an exemplary master-slave latch configuration of a master-slave flip-flop 200, in accordance with various embodiments of the present disclosure. The master-slave flip-flop 200 includes a master latch 202 configured to receive a data signal (labeled "D1" in FIG. 2) and a delayed scan input signal 106 from scan input circuitry 206. Scan input circuitry receives a scan input signal 120 (labeled "SI") to generate a delayed scan input 106. Master latch 202 operates the same as master latch 102. Similarly, slave latch 204 operates the same as slave latch 104. The master-slave flip-flop 200 further includes a slave latch 204 coupled to the master latch 202. The master latch 202 is configured to selectively provide one of the data signal or the delayed scan input signal 106 to the slave latch 204 based on a scan enable signal (labeled "SE") received by the master latch 202. The master latch 202 also receives an inverted version of the scan enable signal (labeled "seb").

In the example of FIG. 2, the master latch 202 includes a plurality of NMOS and PMOS transistors and an inverter. The transistors and the inverter of the master latch 202 are coupled together in the configuration depicted in the figure to achieve the functionality of the master latch 102 described above with reference to FIG. 1. The slave latch 204 of FIG. 2 similarly includes a plurality of NMOS and PMOS transistors and multiple inverters. The transistors and the inverters of the slave latch 204 are coupled together in the configuration depicted in the figure to achieve the functionality of the slave latch 108 described above with reference to FIG. 1. The master and slave latches 202, 204 of FIG. 2 are examples only, and master and slave latches may be implemented in various other ways that are known to those of ordinary skill in the art.

The flip-flop 200 of FIG. 2 receives clock signals (labeled "clkb" and "clkbb") and the scan enable signal (labeled "SE"). In some variations, the clock signals can be based on the logic level of the scan enable signal. In other variations, the clock signals can be independent of the logic level of the scan enable signal.

As previously described, scan input circuitry 206 is operational when the scan enable signal 114 is active (e.g., logic high or '1'). In some variations, such as the one illustrated in FIG. 2, scan input circuitry 206 includes two buffers having at least four inverters coupled together in series. Each inverter can include a PMOS and an NMOS transistor. For example, a first inverter 220 is made up of PMOS transistor 209 and NMOS transistor 208. A second inverter 230 is made up of PMOS transistor 211 and NMOS transistor 210. A third inverter 240 is made up of PMOS transistor 213 and NMOS transistor 212. A fourth inverter 250 is made up of PMOS transistor 215 and NMOS transistor 214. The first inverter 220 coupled to the second inverter 230 form a first buffer. The third inverter 240 coupled to the fourth inverter 250 form a second buffer. The combination of the two buffers of scan input circuitry 206 injects a time delay into the scan input signal 120 to generate a delayed scan input signal 106. Although two buffers are illustrated in scan input circuitry 206, one of skill in the art can appreciate that any number of buffers can be used in order to add or remove delay to the scan input signal 120.

Figure 3:
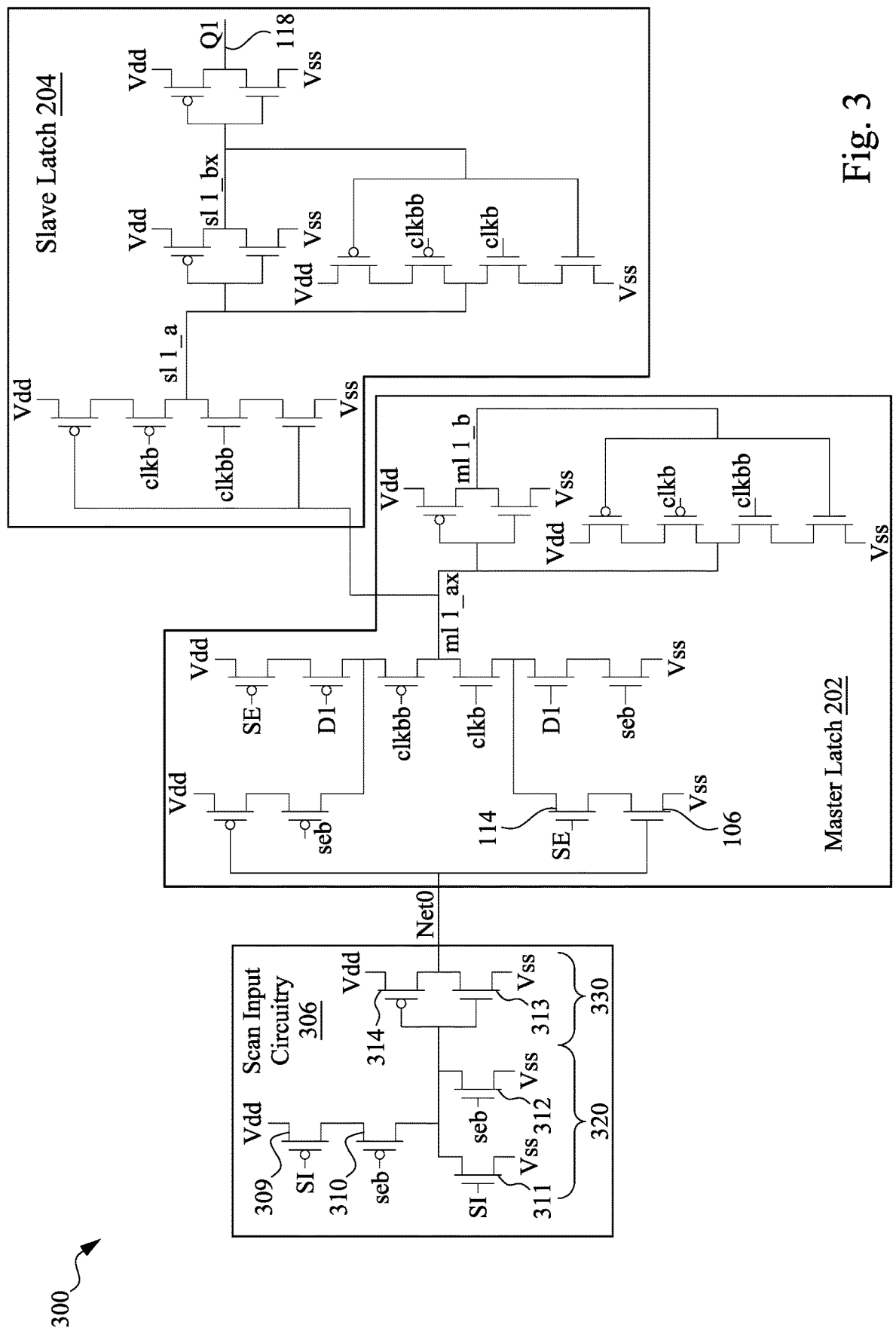
FIG. 3 depicts a circuit diagram of an example master-slave flip-flop in accordance various embodiments of the present disclosure.

FIG. 3 depicts a circuit diagram of an example master-slave flip-flop 300 in accordance various embodiments of the present disclosure. The flip-flop 300 includes a master latch 202 and a slave latch 204 coupled to the master latch 202 as previously described in FIG. 2. In this variation, the scan input circuitry 306 generating the delayed scan input signal 106 differs from scan input circuitry 206. In FIG. 3, the scan input circuitry 306 is a NOR gate 320 made up of PMOS transistors 309, 310 and NMOS transistors 311, 312. The NOR gate 320 is coupled to inverter 330. Inverter 330 is made up of PMOS transistor 314 and NMOS transistor 313. A scan input signal 120 is provided to a gate terminal of PMOS transistor 309. An inverted version of the scan enable signal (e.g., seb) is provided to the gate terminal of PMOS transistor 310. Similarly, a scan input signal 120 is provided to a gate terminal of NMOS transistor 311. An inverted version of the scan enable signal (e.g., seb) is provided to the gate terminal of NMOS transistor 312. The output of the NOR gate 320 is provided to the input of inverter 330 (e.g., the gate terminals of PMOS transistor 314 and NMOS transistor 313). The delayed signal input 106 is the output of the scan input circuitry 306 (e.g., net0 in FIG. 3). The delayed signal input 106 is provided to the master latch 302. Master latch 302 and slave latch 304 operate the same as master latch 102, 202 and slave latch 104, 204, previously described. The stacked PMOS transistors 309, 310 in the NOR gate 320 facilitate a fall delay (e.g., increased hold time).

When scan enable signal is low (e.g., logic '0'), then the delayed signal input 106 (e.g., net0 in FIG. 3) is high (e.g., logic '1') and the master-slave flip-flop 300 flop operates in functional mode as regular flip-flop. When the scan enable signal is high (e.g., logic '1'), then the delay signal input 106 (e.g., net0 in FIG. 3) and master-slave flip-flop 300 operations in scan testing mode.

Figure 4:
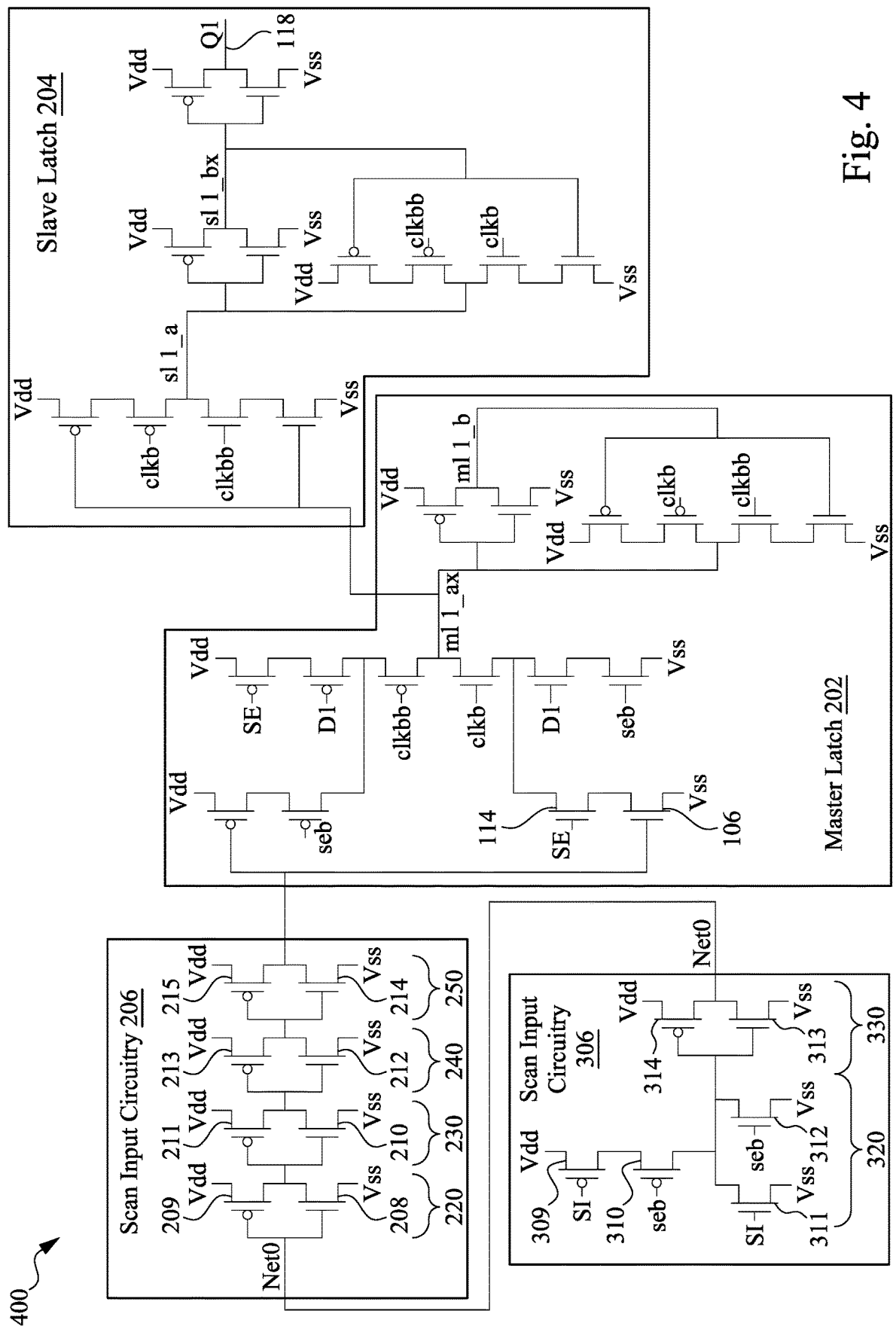
FIG. 4 depicts a circuit diagram of an example master-slave flip-flop in accordance various embodiments of the present disclosure.

FIG. 4 depicts a circuit diagram of an example master-slave flip-flop 400 in accordance various embodiments of the present disclosure. The master-slave flip-flop 400 includes a master latch 202 and a slave latch 204 coupled to the master latch 202 as previously described in FIG. 2. In this variation, the delayed scan input 106 provided to master latch 202 is provided by scan input circuitry 406. Scan input circuitry 406 is a combination of scan input circuitry 206 described in FIG. 2 and scan input circuitry 306 described in FIG. 3. More specifically, the scan input circuitry 306 is coupled to scan input circuitry 206 which in turn is coupled to the master latch 202. The scan input circuitry 306 operates the same as described in FIG. 3, except its output (e.g., net0) is coupled to the input of the first inverter 220. The output of the fourth inverter 250 provided the delayed scan input signal 106 to the master latch 202. The combination of scan input circuitry 306 and scan input circuitry 206 can provide additional delay to the scan input signal 120 so as to improve the hold time of the master-slave flip-flop.

In some variations, the master-slave flip-flop 200 is a single bit flip-flop (e.g., facilitates storage of a single bit of data). In other variations, the master-slave flip-flop 200 is a multi-bit flip-flop (e.g., facilitates storage of multiple bits of data). In the variations of a multi-bit flip-flop, the scan input circuitry 206, 306, 406 is coupled to the scan input of the first bit.

Figure 5:
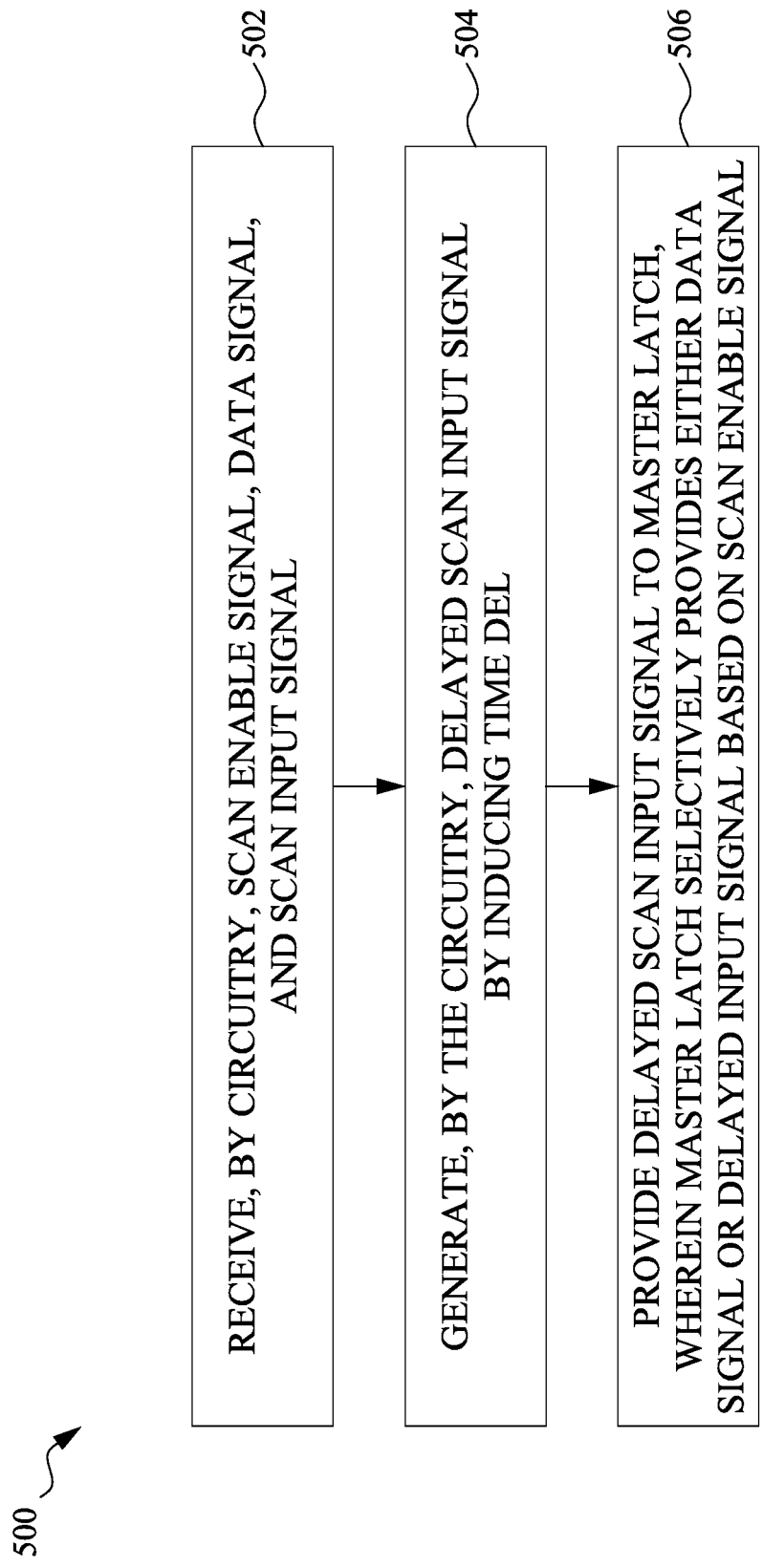
FIG. 5 illustrates an exemplary flow diagram process for delaying a scan input signal using scan input circuitry in accordance with various embodiments of the present disclosure.

FIG. 5 illustrates an exemplary flow diagram 500 process for delaying a scan input signal using scan input circuitry in accordance with various embodiments of the present disclosure. For ease in understanding, the process is described with reference to structures described previously herein. But it is understood that the process applies to many other structures as well. At step 502, circuitry (e.g., scan input circuitry 102, 202, 302, 402) receives a scan enable signal 114, a data signal D1, and a scan input signal 120. At step 504, the circuitry (e.g., scan input circuitry 102, 202, 302, 402) generates a delayed scan input signal 106 by inducing a time delay. The delayed scan input signal 106 is provided to the master latch 202 at step 506. The master latch 202 selectively provides either the data signal D1 or the delayed input signal 106 based on the scan enable signal 114.

Use of the scan input circuitry as described herein can provide a number of advantages. For example, placement of the scan input circuitry within the cell obviates the need of top level routing resources. Additionally, a derate factor is not applied to a buffer delay by a STA tool when the scan input circuitry is placed inside the cell.

In one embodiment, a flip-flop includes circuitry configured to receive a scan input signal and generate a delayed scan input signal. The flip-flop also includes a master latch configured to receive a data signal and the delayed scan input signal. The flip-flop also includes a slave latch coupled to the master latch, the master latch selectively providing one of the data signal or the delayed scan input signal to the slave latch based on a scan enable signal received by the master latch.

In another embodiment, a method for providing a delayed scan input signal to a flip-flop having a master latch and a slave latch includes receiving, by circuitry, a scan enable signal, a data signal, and a scan input signal. The circuitry generates a delayed scan input signal by inducing a time delay. The delayed scan input signal is provided to the master latch, wherein the master latch selectively provides either the data signal or the delayed input signal based on the scan enable signal.

In yet another embodiment, a flip-flop includes circuitry configured to receive a first signal and generate a delayed version of the first signal. The flip-flop also includes a plurality of latches coupled to the circuitry, the plurality of latches configured to receive the delayed version of the first signal and a second signal and selectively output the delayed version of the first signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A flip-flop comprising:
scan input circuitry configured to generate a delayed scan input signal and including a NOR gate that has first and second inputs, each of which is configured to receive a respective one of a scan input signal and a scan enable signal;
a master latch configured to output a data signal or the delayed scan input signal based on the scan enable signal; and
clocking circuitry configured to provide a clock signal to the master latch and to receive an inverted version of the scan enable signal.

2. The flip-flop of claim 1, wherein:
the scan input circuitry further comprises an inverter coupled to the NOR gate;
an output of the NOR gate is coupled to an input of the inverter; and
the delayed scan input signal is output from an output of the inverter.

3. The flip-flop of claim 1, wherein:
the scan input circuitry further comprises a first buffer having a first inverter and a second inverter coupled in series to a second buffer having a third inverter and a fourth inverter; and
the delayed scan input signal is output from an output of the fourth inverter.

4. The flip-flop of claim 2, wherein:
the scan input circuitry further comprises a first buffer comprising a second inverter coupled to a third inverter, and a second buffer comprising a fourth inverter and a fifth inverter;
the NOR gate, the first buffer, and the second buffer are coupled together in series; and
the delayed scan input signal is output from an output of the fifth inverter.

5. The flip-flop of claim 1, wherein the master latch is further configured to receive the inverted version of the scan enable signal.

6. The flip-flop of claim 1, wherein the master latch is further configured to receive an inverted version of the clock signal.

7. A method comprising:
respectively receiving, by first and second inputs of a NOR gate of scan input circuitry, a scan enable signal and a scan input signal;
generating, by the scan input circuitry, a delayed scan input signal;
outputting, by a master latch, a data signal or the delayed scan input signal based on the scan enable signal;
providing, by a clocking circuitry, a clock signal to the master latch; and
receiving, by the clocking circuitry, an inverted version of the scan enable signal.

8. The method of claim 7, wherein:
the scan input circuitry further comprises an inverter coupled to the NOR gate;
an output of the NOR gate is coupled to an input of the inverter; and
the delayed scan input signal is output from an output of the inverter.

9. The method of claim 7, wherein:
the scan input circuitry further comprises a first buffer having a first inverter and a second inverter coupled in series to a second buffer having a third inverter and a fourth inverter; and
the delayed scan input signal is output from an output of the fourth inverter.

10. The method of claim 8, wherein:
the scan input circuitry further comprises a first buffer comprising a second inverter coupled to a third inverter, and a second buffer comprising a fourth inverter and a fifth inverter;
the NOR gate, the first buffer, and the second buffer are coupled together in series; and
the delayed scan input signal is output from an output of the fifth inverter.

11. The method of claim 7, wherein the master latch is further configured to receive the inverted version of the scan enable signal.

12. The method of claim 7, wherein the master latch is further configured to receive an inverted version of the clock signal.

13. A flip-flop comprising:
scan input circuitry configured to generate a delayed version of a first signal and including a NOR gate that has first and second inputs, each of which is configured to receive a respective one of the first signal and a second signal;
a latch coupled to the scan input circuitry and configured to selectively output the delayed version of the first signal based on the second signal; and
clocking circuitry configured to provide a clock signal to the latch and to receive an inverted version of the second signal.

14. The flip-flop of claim 13, wherein:
the scan input circuitry further comprises a second logic gate coupled to the NOR gate;
an output of the NOR gate is coupled to an input of the second logic gate; and
the delayed version of the first signal is output from an output of the second logic gate.

15. The flip-flop of claim 14, wherein the second logic gate comprises an inverter.

16. The flip-flop of claim 13, wherein:
the scan input circuitry further comprises a second logic gate having at least two logic components coupled in series to a third logic gate having at least two logic components; and
the delayed version of the first signal is output from an output of the third logic gate.

17. The flip-flop of claim 16, wherein the second logic gate and the third logic gate are buffers and the at least two logic components comprise an inverter.

18. The flip-flop of claim 13, wherein the latch is further configured to selectively output a third signal.

19. The flip-flop of claim 13, wherein the latch is further configured to receive the inverted version of the second signal.

20. The flip-flop of claim 1, wherein the scan input circuitry receives the scan enable signal such that the scan enable signal bypasses the master latch.

* * * * *